(12) United States Patent
Benckenstein, Jr. et al.

(10) Patent No.: US 8,055,462 B1
(45) Date of Patent: Nov. 8, 2011

(54) SYSTEM USING FUEL GAUGE

(75) Inventors: Claude Leonard Benckenstein, Jr., Sugarland, TX (US); Clint Alfred Davis, Stafford, TX (US); Dean Perkins, Tomball, TX (US)

(73) Assignee: Southwest Electronic Energy Corporation, Stafford, TX (US)

( * ) Notice: Subject to any disclaimer, the term of this patent is extended or adjusted under 35 U.S.C. 154(b) by 709 days.

(21) Appl. No.: 12/190,872

(22) Filed: Aug. 13, 2008

(51) Int. Cl.
*G01R 31/36* (2006.01)
(52) U.S. Cl. .............. 702/63; 702/65; 320/132
(58) Field of Classification Search .......... 702/60, 702/61, 63–65, 136; 320/132, 149; 324/426–428
See application file for complete search history.

(56) References Cited

U.S. PATENT DOCUMENTS 5,614,829 A * 3/1997 Song ...................... 324/427
7,397,217 B2 * 7/2008 Van Brocklin et al. ....... 320/101

* cited by examiner

*Primary Examiner* — Manuel L Barbee
(74) *Attorney, Agent, or Firm* — Fulbright & Jaworski L.L.P.

(57) ABSTRACT

A system for counting electrons including a power supply producing a current, a fuel gauge in communication with the power supply, a reader with a reader processor and display, wherein the reader is in communication with a microprocessor of the fuel gauge, and wherein the microprocessor transmits to the reader the established standard engineering unit of capacity, and wherein the reader processor displays the established standard engineering unit of capacity on the display; and a modem in communication with the fuel gauge, wherein the modem provides a communication signal over power lines of the fuel gauge.

8 Claims, 3 Drawing Sheets

SYSTEM USING FUEL GAUGE

FIELD

The present embodiments relate to a system for tracking electron flow from a power source.

BACKGROUND

A need exists for a system that accurately measures and tracks electron flow that is portably usable in many environments, including those where the recording of elapsed time is not possible, easy to undertake, and inexpensive to operate.

A further need exists for a system that can be installed on a wide variety of power supplies for remote and close proximity monitoring of electron usage by a customer, a user, and an administrator simultaneously, to determine remaining capacity of a power source.

The present embodiments meet these needs.

BRIEF DESCRIPTION OF THE DRAWINGS

The detailed description will be better understood in conjunction with the accompanying drawings as follows.

The present embodiments are detailed below with reference to the listed Figures.

DETAILED DESCRIPTION OF THE EMBODIMENTS

Before explaining the present embodiments in detail, it is to be understood that the invention is not limited to the particular embodiments and that it can be practiced or carried out in various ways.

Typically, remaining capacity of a power source is measured by recording the amount of current maintained per a unit of time. In extreme conditions, such as the high temperatures and pressures encountered within a wellbore, the accurate tracking of the passage of time, such as through use of a processor-based clock, is not possible.

The present system measures the capacity of a power source independent of elapsed time by tracking electron flow, rather than current per unit time. During operation of a power source, an integrator receives a voltage proportional to the current maintained from the power source to a load. Prior to the saturation of the integrator, a microprocessor converts the voltage to a monotonic uni-polar representation of an aggregate number of electrons and records this value. Once this value reaches a calibration constant, a known quantity of current has been maintained, such as one mA/hour, enabling capacity of the power source to be calculated in standard engineering units. The accumulated value can then be reset, allowing further accumulation until the calibration constant is again reached.

The present embodiments relate to a system for counting electrons from a power source. The system can include a power source producing a current, a fuel gauge in communication with the power source for measuring electron flow, and a reader having a reader processor and a display.

The reader can be in communication with a microprocessor of the fuel gauge. The microprocessor transmits to the reader the capacity of the power supply determined by the fuel gauge in the form of an established standard engineering unit of capacity, and the reader processor displays the established standard engineering unit of capacity on the display for continuous and automatic viewing by a user.

A modem can be used in communication with the fuel gauge. The modem provides a communication signal over power lines of the fuel gauge.

The system monitors a power source, that can be a battery, a fuel cell, a solar panel system, a capacitor, or combinations thereof.

The reader can be a personal digital assistant, a handheld scanner, a computer, a cellular telephone, a phone, or another electrical device, as long as the device can perform the necessary processing.

Figure 1:
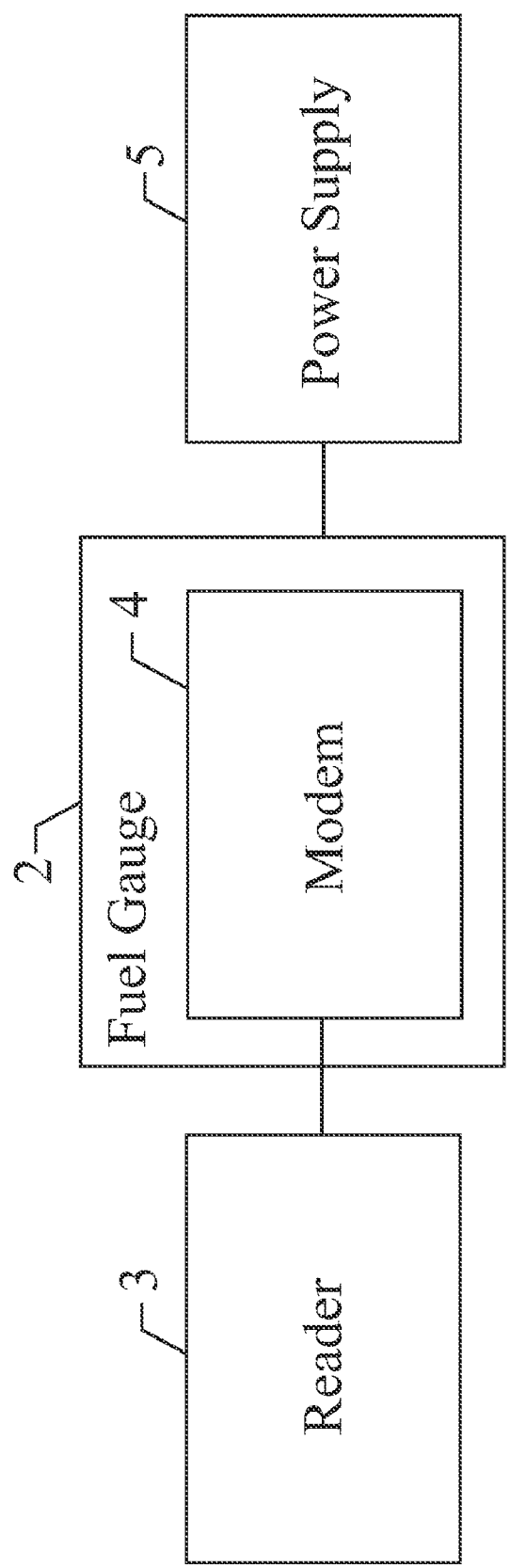
FIG. 1 depicts the overall system.

Turning now to the Figures, FIG. 1 shows an embodiment of the present system, having the fuel gauge (2), connected to a power supply (5) for determining the capacity of the fuel supply (5). This information can be transmitted via a modem (4), connected to the fuel gauge (2), to a reader (6). The reader can display information relating to the remaining capacity of a fuel supply (5).

Figure 2:
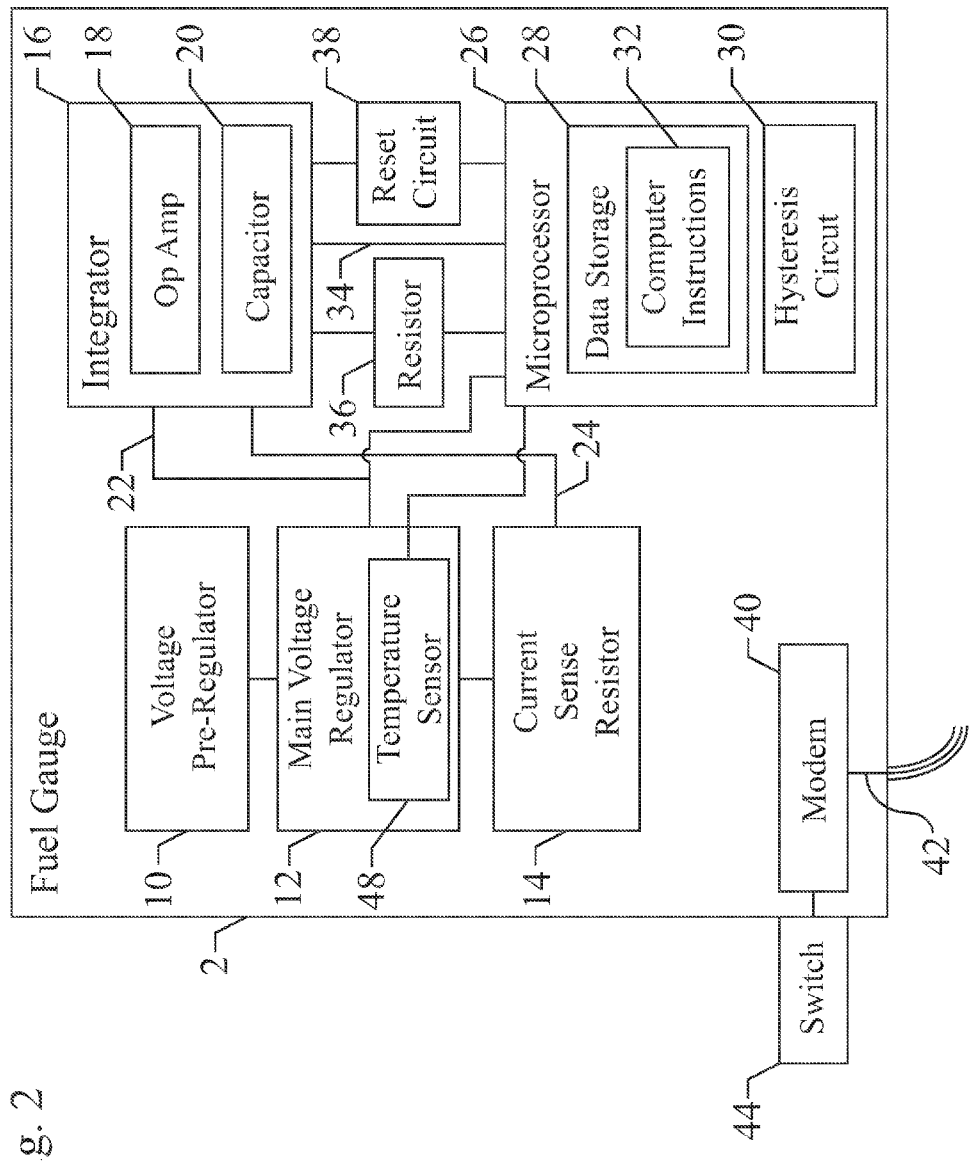
FIG. 2 depicts the fuel gauge usable in the system.

FIG. 2 shows the fuel gauge in greater detail. The fuel gauge (2) has, in an embodiment, a voltage pre-regulator (10) for receiving current and providing a preset voltage. The voltage pre-regulator (10) is designed for 10-80V applications to provide about 6 Volts. In an embodiment, the voltage pre-regulator can be resistant to extreme temperature, high pressure, shock and vibration.

Additionally, the fuel gauge has a main voltage regulator (12) in communication with the voltage pre-regulator for receiving the preset voltage and proving power to other components of the fuel gauge. The regulator can be a band gap device, designed for precision measurement applications, and is contemplated to be precise to within about 1 percent. In an embodiment, the main voltage regulator can have a maximum voltage tolerance of about 80V. In one embodiment the main voltage regulator can contain a temperature sensor (48).

An example of the voltage pre-regulator can be one such as LT3014BES5 made by Micropower. An example of the main voltage regulator can be among the voltage regulators produced by Analog Devices.

A current sense resistor (14) can be a WSL2512R1000FEA made by Vishay of Pennsylvania, and can be in communication with the main voltage regulator (12) for converting the current to a voltage proportional to the current.

In an embodiment, the main voltage regulator (12) can be a precision regulator, and the current sense resistor can be a precision resistor.

An integrator (16) is shown, having an op amp (18) such as a LTC2054HS5 made by Linear Technologies and a capacitor (20). The integrator receives power (22) from the main voltage regulator (12), and receives an input voltage proportional to current (24) from the current sense resistor (14). In an embodiment, the integrator can have a saturation voltage ranging from about 0 volts to about 3 volts.

A microprocessor (26) with data storage (28), such as a MC908QB8MDTE made by Freescale, can contain a hysteresis circuit (30) known to those in the field of electrical engineering. A hysteresis circuit (30), external to the microprocessor (26), can also be contemplated for determining power supply usage as described herein. The microprocessor can be contemplated to remain in a low power state until activated. It can be contemplated that the microprocessor consumes from about 1 microwatt to about 3 microwatts of power when in the low power state.

The data storage (28), which can be fixed, removable, or remote data storage, can include computer instructions (32) for instructing the microprocessor (26) to convert the voltage proportional to current to a monotonic uni-polar representation of an aggregate number of electrons (34).

A resistor (36) is disposed between the integrator (16) and the microprocessor (26) for activating the microprocessor from the low power state prior to saturation of the integrator with the voltage proportional to current.

A reset circuit (38) is disposed between the microprocessor and the integrator for resetting the monotonic uni-polar representation of an aggregate number of electrons to zero. In an embodiment, the reset circuit resets the integrator to zero in less than three microseconds for ensuring accuracy.

In an embodiment, the fuel gauge has a modem (40) for providing a communication signal (42) over power lines of the fuel gauge. A switch (44) can be used for controlling power to the modem.

In an embodiment, the op amp can be a low power and low drift device. The op amp can be one such as model LTC2054HS5 available from Linear Technologies which provides a low pollution due to noise. The op amp can receive power from the main voltage regulator. The op amp operates using a logic input that cycles to activate and deactivate the op amp.

The hysteresis circuit provides a discrete rapid output in response to a slowly changing input. The output of this circuit can be either logic 0 or 1, but input must change significantly for output to change.

The present embodiments also relate to a method for tracking electron flow from a power source using a networked system that can utilize alarms and meters, when electron flow is at a reduced level, and accurately and precisely tracks electron flow to determine capacity of the power source.

First, a current from a power source is measured which is then termed "a measured current". The power supply can be a lithium primary battery, a lithium-ion battery, a lead acid battery, a fuel cell, or another source of electrical energy that provides a flow of electrons in a direct current, such as electrons generated by an alternator of a car, or a generator of a boat or RV.

Next, the measured current is converted to a voltage. The conversion occurs, in an embodiment, using a current sense resistor, such as a model WSL2512R1000FEA resister made by Vishay of Pennsylvania. In one embodiment, the current sense resistor can handle between about 0 amps and about 6 amps of current.

The current can be a pulsed current or a constant current. In an embodiment, if the current is pulsed, is can be pulsed at about 2 amps every one second or about 1 amp every 2 seconds, or other variations of pulsed current. If the current is constant, for example, it can be about 100 mA.

The converted current, is integrated into a monotonic uni-polar representation of an aggregate number of electrons. The amplitude of the voltage is representative of the aggregate number of electrons flowing through a current sense resistor after integration using a Deboo (non-inverting) integrator with a capacitor.

The Deboo integrator is a non-inverting uni-polar integrator that forms a monotonic, unidirectional signal, wherein the amplitude represents the number of electrons flowed, similar to a trip odometer tracking mileage of a car. Other integrators can be usable herein, such as passive integrators described in generally known in the field of electrical engineering.

When the integrator, reaches a preset limit of aggregate electrons, or a as a threshold, then the amplitude representative of the aggregate number of electrons is "read" by the microprocessor forming a reading internal to the microprocessor.

Using an analog-to-digital converter, such as a AD7819 made by Analog Devices, the amplitude is identified and stored in memory of the microprocessor. Additionally, in an embodiment it is contemplated that the reading is formed using an analog-to-digital converter within the microprocessor.

Once the preset limit is reached, a value is recorded and added to previously recorded valves on the microprocessor. The microprocessor also contains instructions for resetting the integrator by discharging the integrator. Once the integrator is discharged, the amplitude of its output voltage begins at 0 Volts and increases towards the preset limit as a function of the aggregate number of electrons that pass the current sense resistor.

Figure 3:
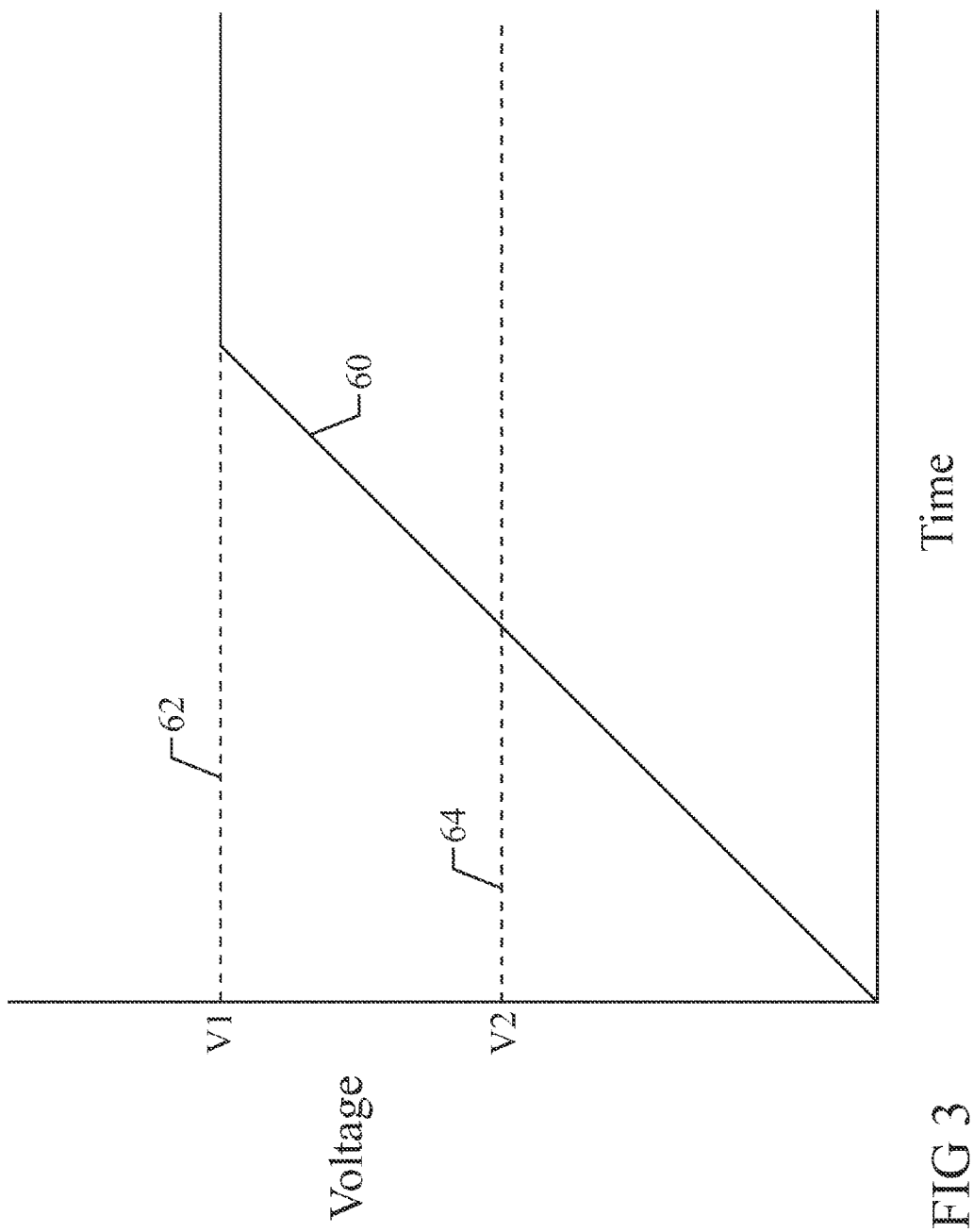
FIG. 3 shows a representative amplitude signal usable in this system.

FIG. 3 illustrates a representative amplitude signal as produced by the integrator for use in the invention herein. The voltage (60) produced by the integrator circuit, as illustrated, is a function of time where a generally constant input voltage has been applied current sense resistor. FIG. 3 also illustrates the saturation point $V_1$ (62) of the integrator. It can be seen once the integrator becomes saturated the output voltage no longer increases regardless of the input voltage. FIG. 3 illustrates a preset limit $V_2$ (64), which is selected at a voltage below the saturation point $V_1$ (62) of the integrator. It should be appreciated that the amplitude signal will vary based upon the input signal in a predictable way known to those in the art based on the configuration of the integrator.

Prior to electron saturation, the reading can be made by the microprocessor, which can be MC908QBMDTE such as those made by Freescale of Austin, Tex. The microprocessor can have a processor and data storage containing computer instructions for instructing the processor to accumulate amplitude measurements when the preset limit is reached. Each reading can be added to a memory location in the data storage where it is combined with previous readings forming a summation.

The microprocessor can contain instructions for storing the value of the amplitude voltage and for adding each value to a previous sum forming a running summation. This summation is representative of the total charge which has passed from the power source and is herein referred to as "an accumulator value".

Additionally, the microprocessor can contain instructions for resetting the integrator, or discharging the integrator, once the voltage of amplitude signal reaches a preset limit $V_2$ (64). Once this occurs, the amplitude signal will be reset, and will generally increase as a function of the signal input into the integrator as previously described.

The readings are repeated by actuating of the microprocessor before the integrator reaches the preset limit. With each reading, the accumulator value is transmitted to the accumulator, and the summation continues, causing the accumulator value to increase or remain constant, but never decrease.

The summation is then compared to a calibration value for the particular fuel gauge. The calibration value is preloaded in the data storage. The calibration value is unique to each designated fuel gauge circuit. An example of a calibration value is 14,000. It should be noted that when the accumulator reaches the calibration constant, a known quantity of power has flowed, such as 1 mAH, enabling accurate electron tracking and determination of power source capacity.

The comparison is then recorded as an established standard engineering unit of capacity, such as Amp Hours when the summation of accumulator values meets or exceeds the calibration value.

In an embodiment, the reader can be in wireless communication with the microprocessor of the fuel gauge used in the system. The reader can also be in wired communication with the microprocessor, or can use both wired and wireless communication methods.

Similarly, the modem can be in wireless communication with the fuel gauge, wired communication with the fuel gauge, or combinations thereof.

In an embodiment, the reader can be in communication with the microprocessor using the modem.

In a contemplated embodiment, the fuel gauge, the reader, the modem, or combinations thereof, can receive power from the power source.

The fuel gauge can be usable with lead acid batteries, lithium primary batteries, lithium ion batteries, fuel cells and solar panel systems. The fuel gauge can be useable for high precision tracking of electron flow to determine capacity. The fuel gauge can further operate by counting electrons from a power source.

In an additional embodiment, the fuel gauge can monitor and record ambient temperature, that is the temperature surrounding the power supply using a temperature sensor. After the temperature is read, then the established standard engineering unit of capacity is adjusted based on the ambient temperature.

In the fuel gauge, the current sense resistor is a sensor that determines current proportional to voltage. An example of such a current sense resistor can be model WSL2512R1000FEA made by Vishay of Pennsylvania.

The microprocessor used in the system enables the sensing of electron flow at temperatures ranging from about −40 degrees Centigrade to about 150 degrees Centigrade.

It should be noted that the established standard engineering unit of capacity, from the microprocessor, can be determined using a reader in a manner known to those in the field of electrical engineering.

In one embodiment, the fuel gauge can have a reader that communicates the established standard engineering unit of capacity to a user who is using at least one light emitting diode.

The communication from the reader can be over a wireless network, a hard wired network, a satellite network, or combinations thereof. The user can be connected to a website, or be connected to a graphical user interface display directly for viewing electron flow, and the fuel usage occurring to the power supply.

When the reader is in communication with a network, the fuel gauge permits continuous and automatic remote monitoring of power supply capacity.

An example of automatic, and continuous, real time monitoring is with an executive dashboard that is continually pushing the data to the user, rather than the user asking for the data. This push enables better and more accurate monitoring of the fuel use.

Monitoring using an executive dashboard enables a user to view that constant status of multiple power supplies, such as batteries, each connected via the network for constant and highly accurate measurement, such within 1 mV. Monitoring using an executive dashboard also allows for less waste of fuel, particularly in a remote environment, such as a recharging station for military radios in the middle of a barren arctic wasteland.

In an embodiment it is contemplated that the capacitor of the integrator has at least two miniature 0.01 microfarad value capacitors, each having a low loss, high temperature rating, such as 125 Centigrade, with a moderately high capacitance.

It is contemplated that a moderately high capacitance would be equivalent to about 0.22 microfarads for each capacitor.

The two capacitors are contemplated to be connected in parallel and therefore provide a capacitance of about 0.44 total microfarads. An example of such a miniature 0.01 microfarad value capacitor would be a high tech plastic fill capacitor made by Fujitsu.

A different embodiment contemplates that the capacitor can be a precision capacitor, which can have a capacity of about 0.02.

In an embodiment the preset limit of aggregate electrons can be no more than three volts using a 12 bit converter.

While these embodiments have been described with emphasis on the embodiments, it should be understood that within the scope of the appended claims, the embodiments might be practiced other than as specifically described herein.

What is claimed is:

1. A system for counting electrons from a power supply, the system comprising:
    a power supply producing a current;
    a fuel gauge in communication with the power supply, the fuel gauge comprising:
        a voltage pre-regulator for receiving the current and providing a preset voltage;
        a main voltage regulator in communication with the voltage pre-regulator for receiving the preset voltage and providing power to other components of the fuel gauge;
        a current sense resistor in communication with the main voltage regulator for converting the current to a voltage;
        an integrator comprising an op amp and a capacitor, wherein the integrator receives power from the main voltage regulator, and integrates the voltage from the current sense resistor to form a voltage proportional to current;
        a microprocessor comprising data storage and a hysteresis circuit, wherein the microprocessor is in a low power state until activated, and wherein the data storage comprises computer instructions for instructing the microprocessor to convert the voltage proportional to current to a monotonic uni-polar representation of an aggregate number of electrons and computer instructions for instructing the microprocessor to convert the monotonic uni-polar representation of an aggregate number of electrons to an established standard engineering unit of capacity;
        a resistor disposed between the integrator and the microprocessor for activating the microprocessor from the low power state prior to saturation of the integrator with the voltage proportional to current; and
        a reset switch disposed between the microprocessor and the integrator for resetting the monotonic uni-polar representation of an aggregate number of electrons to zero;
    a reader comprising a reader processor and display, wherein the reader is in communication with the microprocessor, and wherein the microprocessor transmits to the reader the established standard engineering unit of capacity, and wherein the reader processor displays the established standard engineering unit of capacity on the display; and
    a modem in communication with the fuel gauge, wherein the modem provides a communication signal over power lines of the fuel gauge.

2. The system of claim 1, wherein the power supply is a battery, a fuel cell, a solar power system, a capacitor, or combinations thereof.

3. The system of claim 1, wherein the reader is a computer, a handheld scanner, a cellular telephone, a phone, a personal digital assistant, or combinations thereof.

4. The system of claim 1, wherein the modem is in wireless communication with the fuel gauge.

5. The system of claim 1, wherein the reader is in wireless communication with the microprocessor, wired communication with the microprocessor, or combinations thereof.

6. The system of claim 5, wherein the reader is in communication with the microprocessor using the modem.

7. The system of claim 1, wherein the modem is in wireless communication with the fuel gauge, wired communication with the fuel gauge, or combinations thereof.

8. The system of claim 1, wherein the fuel gauge, the reader, the modem, or combinations thereof, receive power from the power supply.

* * * * *